US008664092B2

United States Patent
Kawasaki

(10) Patent No.: US 8,664,092 B2
(45) Date of Patent: Mar. 4, 2014

(54) METHOD FOR CLEANING SILICON WAFER, AND METHOD FOR PRODUCING EPITAXIAL WAFER USING THE CLEANING METHOD

(75) Inventor: Tomonori Kawasaki, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 13/378,065

(22) PCT Filed: Jun. 24, 2010

(86) PCT No.: PCT/JP2010/004204
§ 371 (c)(1),
(2), (4) Date: Dec. 14, 2011

(87) PCT Pub. No.: WO2010/150547
PCT Pub. Date: Dec. 29, 2010

(65) Prior Publication Data
US 2012/0100701 A1 Apr. 26, 2012

(30) Foreign Application Priority Data
Jun. 26, 2009 (JP) .................. 2009-152898

(51) Int. Cl.
*H01L 21/20* (2006.01)
*H01L 21/302* (2006.01)
*H01L 21/306* (2006.01)
*H01L 21/465* (2006.01)

(52) U.S. Cl.
USPC ........... 438/478; 438/704; 438/706; 438/906; 257/E21.09

(58) Field of Classification Search
USPC ............ 438/478, 704, 706, 906; 257/E21.09
See application file for complete search history.

(56) References Cited

U.S. PATENT DOCUMENTS

| 5,896,875 | A * | 4/1999 | Yoneda ...................... 134/102.3 |
| 6,124,210 | A * | 9/2000 | Chino et al. .................. 438/706 |
| 7,051,743 | B2 * | 5/2006 | Kim et al. ..................... 134/151 |
| 2001/0045224 | A1* | 11/2001 | Kamikawa et al. ............ 134/61 |
| 2003/0221705 | A1* | 12/2003 | Han et al. .......................... 134/2 |
| 2004/0080053 | A1* | 4/2004 | Wang et al. .................... 257/774 |
| 2005/0121053 | A1* | 6/2005 | Lee et al. ............................ 134/2 |
| 2007/0228524 | A1* | 10/2007 | Hayashida et al. ............ 257/618 |
| 2009/0293717 | A1* | 12/2009 | Izumi et al. ...................... 95/22 |
| 2010/0093179 | A1* | 4/2010 | Hori et al. ...................... 438/723 |

FOREIGN PATENT DOCUMENTS

DE    10 2006 020 825    11/2007

(Continued)

*Primary Examiner* — Charles Garber
*Assistant Examiner* — Ron Pompey
(74) *Attorney, Agent, or Firm* — Clark & Brody

(57) ABSTRACT

A silicon wafer after being subjected to mirror polishing but before being subjected to form an epitaxial layer thereon is subjected to an ozone gas treatment that oxidizes a surface of the silicon wafer by use of ozone gas, a hydrofluoric acid gas treatment that dissolves and removes the oxidized surface of the silicon wafer by use of hydrofluoric acid gas, and a washing treatment that removes foreign substances remaining on the surface of the silicon wafer, whereby PIDs (Polishing Induced Defects) generated by the mirror polishing are forcedly oxidized, dissolved and removed. By performing epitaxial treatment thereafter, PID-induced convex defects can be prevented from generating on the surface of the epitaxial wafer.

4 Claims, 5 Drawing Sheets

(a) After mirror polishing (b) After cleaning treatment (c) After epitaxial treatment

(56) References Cited

FOREIGN PATENT DOCUMENTS

| JP | 410199847 | * | 7/1998 |
|---|---|---|---|
| JP | 10-310883 | | 11/1998 |
| JP | 2000-331976 | | 11/2000 |
| JP | 2004-281620 | | 10/2004 |
| JP | 2007-273911 | | 10/2007 |
| JP | 2008-159892 | | 7/2008 |
| JP | 2008-205147 | | 9/2008 |
| WO | 2009/072406 | | 6/2009 |

* cited by examiner (a) After mirror polishing (b) After cleaning treatment (c) After epitaxial treatment (a) After mirror polishing (b) After epitaxial treatment (a) After mirror polishing (b) After cleaning treatment (c) After epitaxial treatment (a) After mirror polishing (b) After cleaning treatment (c) After epitaxial treatment

METHOD FOR CLEANING SILICON WAFER, AND METHOD FOR PRODUCING EPITAXIAL WAFER USING THE CLEANING METHOD

TECHNICAL FIELD

The present invention relates to a method for cleaning a silicon wafer after being subjected to mirror polishing, and a method for producing an epitaxial wafer using the cleaning method, and particularly to a silicon wafer cleaning method and a method for producing an epitaxial wafer, which can secure the surface quality of the epitaxial wafer.

BACKGROUND ART

A silicon wafer to be used for a semiconductor device is produced from an ingot of silicon single crystal grown by the Czochralski method or the like. In general, the single crystal ingot is processed into a cylindrical form in an outer periphery grinding step, and sliced into a disk-like blank wafer in a slicing step. The blank wafer is then finished to have a specific diameter in a chamfering step by chamfering the periphery thereof; the parallelism of surfaces is adjusted in a rough polishing (lapping) step by polishing opposite surfaces thereof; the resulting wafer is subjected to chemically remove processing strain/distortion in an etching step; and it is finally finished into a mirror surface with high flatness in a mirror polishing (polishing) step by means of mechanochemical polishing using a polishing agent such as a colloidal silica solution. The silicon wafer after the mirror polishing is cleaned in a washing step to remove foreign substances such as particles or metals remaining on the surface thereof.

In the washing step, for example, as shown in Patent Literature 1, the wafer surface is washed by performing an ozone water treatment that oxidizes the wafer surface by use of ozone water, and a diluted hydrofluoric acid treatment that removes an oxide film on the wafer surface by use of a diluted hydrofluoric acid (a diluted aqueous solution of hydrogen fluoride) or alternately repeating these treatments as occasion demands. Thereafter, the resulting wafer is subjected to a pure water treatment using pure water, and finally to a spin drying treatment.

The silicon wafer for which the cleaning is completed is often subjected to a special treatment to adjust the properties of the surface or the surface vicinity thereof according to the intended use of a semiconductor device to which the silicon wafer is applied. The most well-known one among such special treatments is an epitaxial treatment for vapor-depositing an epitaxial layer on the surface of the silicon wafer for production of an epitaxial wafer having the epitaxial layer formed on the silicon wafer surface. The epitaxial wafer is high in crystal integrity, and is frequently used for a highly-integrated semiconductor device because of excellent characteristics thereof.

In recent years, minute convex defects on the silicon wafer surface which could not be detected in the past have been recognized as a problem as the defect detectability is remarkably improved in association with the progress of inspection equipment and technology. Such convex defects can be detected using a wafer surface defect inspection equipment (e.g., MAGICS by Lasertec Corporation, Surfscan SP2 by KLA-Tencor Corporation), and appear in a dot-like or linear shape.

It has been revealed that such minute convex defects are generated during the mirror polishing step, and they are called PIDs (Polishing Induced Defects). Many of the PIDs remain without being removed in the cleaning process and induce, during the formation of the epitaxial layer, convex defects on the surface of the epitaxial wafer.

A method for finish-polishing a silicon wafer is described in Patent Literature 2, wherein the polishing rate in finish polishing on the final stage of the mirror polishing step is set to 10 nm/min or less. This finish-polishing method can suppress generation of PIDs by limiting the polishing rate.

CITATION LIST

Patent Literature

Patent Literature 1: Japanese Patent Application Publication No. 2007-273911
Patent Literature 2: Japanese Patent Application Publication No. 2008-205147

SUMMARY OF INVENTION

Technical Problem

In the finish-polishing method described in the above-mentioned Patent Literature 2, it is difficult to completely prevent PIDs from generating in the mirror polishing step although the generation of PIDs can be reduced to some extent. On the other hand, when PIDs exist in the silicon wafer after the mirror polishing, many of the PIDs remain thereon even after the cleaning process, and induce convex defects on the surface of the epitaxial wafer, as described above. Therefore, the finish-polishing method described in the above-mentioned Patent Literature 2 is insufficient for securing the surface quality of the epitaxial wafer.

The present invention has been achieved in consideration of the above-mentioned problem, and it is an object of the present invention to provide a method for cleaning a surface of a silicon wafer and a method for producing an epitaxial wafer, capable of sufficiently securing the surface quality of an epitaxial wafer by preventing PID-induced convex defects from generating on the surface of the epitaxial wafer.

Solution to Problem

As a result of detailed deliberations and various tests on the production process of silicon wafers to attain the above-mentioned object, the present inventor obtained the following findings.

The mechanism of generation of PIDs in the mirror-polishing step can be presumed as follows. In abrasives during mirror polishing, there are not only free abrasive grains such as colloidal silica but also foreign substances such as aggregated grains formed by the gelling of the free abrasive grains and particles other than the free abrasive grains. Such foreign substances locally cause pressure concentration on the wafer surface, and a pressurized local portion is transformed into an amorphous oxide ($SiO_x$). The local portion transformed into the amorphous oxide is less polishable, compared with an untransformed, normal Si portion surrounding it, so the polishing for the local portion delays, and the local portion comes up as a minute convex defect (PID)

FIG. 1 are schematic views for illustrating how a convex defect is generated on a surface of an epitaxial wafer due to a PID, wherein FIG. 1(a), FIG. 1(b), and FIG. 1(c) respectively show the cases after mirror polishing, after cleaning and after epitaxial treatment.

When a PID 4 is generated on a surface 1a of a silicon wafer 1 in the mirror polishing step as shown in FIG. 1(a), and if the silicon wafer 1 is subjected to an ozone water treatment and a diluted hydrofluoric acid treatment similarly as in an ordinary cleaning process, the PID 4 is not removed but rather increases in height and remains as shown in FIG. 1(b). This is because the PID 4 is transformed into the amorphous oxide, and is hardly oxidized by the ozone treatment nor hardly dissolved by the diluted hydrofluoric acid treatment in comparison with the untransformed normal Si portion around the PID 4. Namely, it is because the etching rate of the transformed PID 4 is lower than that of the Si portion surrounding it.

When the silicon wafer 1 with the PID 4 remaining thereon is subjected to an epitaxial treatment for obtaining an epitaxial wafer, an epitaxial layer 3 is vapor-deposited on the whole area of the surface 1a of the silicon wafer 1 including the portion of the PID 4, as shown in FIG. 1(c). Accordingly, a gently projecting convex defect 5 is generated on a surface 3a of the epitaxial layer 3 in the epitaxial wafer 2 at a location corresponding to that of the PID 4.

FIG. 2 are observation pictures each showing the appearance of a convex defect generated on a surface of an epitaxial wafer due to a PID, wherein FIG. 2(a) and FIG. 2(b) respectively show appearances after mirror polishing and after epitaxial treatment. FIG. 2(a) shows the surface of the silicon wafer after being subjected to the mirror polishing and FIG. 2(b) does the surface of the epitaxial wafer after being subjected to the washing step and epitaxial treatment, both of which are observed with the MAGICS for the same field of view. The thickness of the epitaxial layer is 5 μm.

As being noted from FIGS. 2(a) and (b), a gently protruding convex defect is generated on the surface of the epitaxial wafer at a location corresponding to that of the PID generated on the surface of the silicon wafer after being subjected to the mirror polishing.

Derived from these facts by present inventor is an inference that when PIDs are generated in the mirror polishing step, PID-induced convex defects can be prevented from generating on the surface of the epitaxial wafer if the transformed PIDs can be removed prior to the epitaxial treatment, and thus the present inventor further made various investigations thereon. As a result, the present inventor found that the PIDs transformed to the amorphous oxide ($SiO_x$) can be forcedly oxidized into $SiO_2$ by ozone gas at a stage prior to the washing step, PIDs which have been made into $SiO_2$ can be completely dissolved and removed by hydrofluoric acid gas, and an epitaxial wafer free of the PID-induced convex defects and having excellent surface quality can be consequently produced.

The present invention was completed based on the above-mentioned findings, and summaries of the present invention consist in (1) a silicon wafer cleaning method and (2) a method for producing an epitaxial wafer described below.

(1) A method for cleaning a surface of a silicon wafer after being subjected to mirror polishing but before being subjected to form an epitaxial layer thereon, includes: an ozone gas treatment step that oxidizes the surface of the silicon wafer by use of ozone gas; and a hydrofluoric acid gas treatment step that dissolves and removes the oxidized surface of the silicon wafer by use of hydrofluoric acid gas.

In the above-mentioned cleaning method (1), it is preferable that the silicon wafer is held in an atmosphere of ozone gas in the ozone gas treatment step, and the silicon wafer is held in an atmosphere of hydrofluoric acid gas in the hydrofluoric acid gas treatment step.

In the above-mentioned cleaning method (1), it is preferable that the silicon wafer is subjected, after the hydrofluoric acid gas treatment step, to a washing step that removes foreign substances remaining on the surface of the silicon wafer.

In this case, in the washing step, the silicon wafer may be subjected to an ozone water treatment and a diluted hydrofluoric acid treatment. The silicon wafer is preferably subjected to a pure water treatment after the ozone water treatment and the diluted hydrofluoric acid treatment.

(2) A method for producing an epitaxial wafer includes: vapor-depositing an epitaxial layer on a surface of a silicon wafer which has been cleaned by the above-mentioned cleaning method (1).

Advantageous Effects of Invention

According to a method for cleaning a silicon wafer by the present invention, PIDs can be forcedly oxidized by performing the ozone gas treatment step and dissolved and removed by performing the hydrofluoric acid gas treatment step prior to the epitaxial treatment. Therefore, by performing the epitaxial treatment after these steps, PID-induced convex defects can be prevented from generating on the surface of the epitaxial layer, and an epitaxial wafer excellent in surface quality can be produced.

DESCRIPTION OF EMBODIMENTS

Hereinafter, embodiments of a silicon wafer cleaning method and a method for producing an epitaxial wafer of the present invention will be described in detail.

Figure 1:
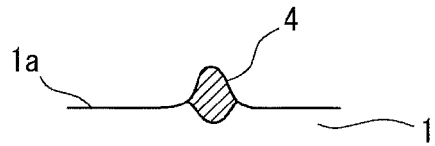
FIG. 1 are schematic views for illustrating how a convex defect is generated on a surface of an epitaxial wafer due to a PID, wherein FIG. 1(a), FIG. 1(b), and FIG. 1(c) respectively show the cases after mirror polishing, after cleaning and after epitaxial treatment.
Figure 1:
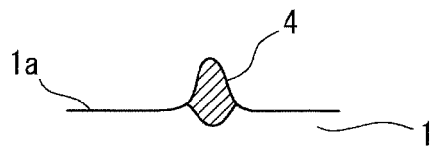
Figure 1:
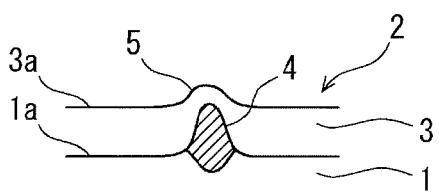
Figure 2:
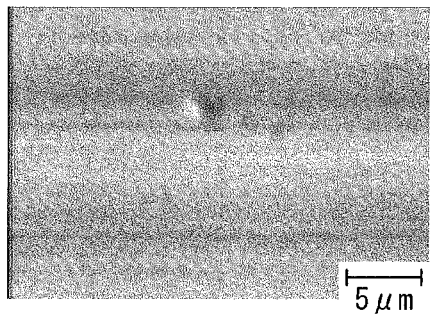
FIG. 2 are observation pictures each showing the appearance of a convex defect generated on a surface of an epitaxial wafer due to a PID, wherein FIG. 2(a) and FIG. 2(b) respectively show appearances after mirror polishing and after epitaxial treatment.
Figure 2:
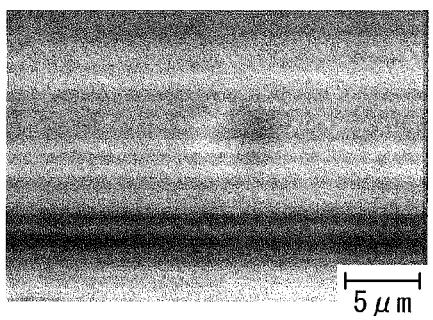
Figure 3:
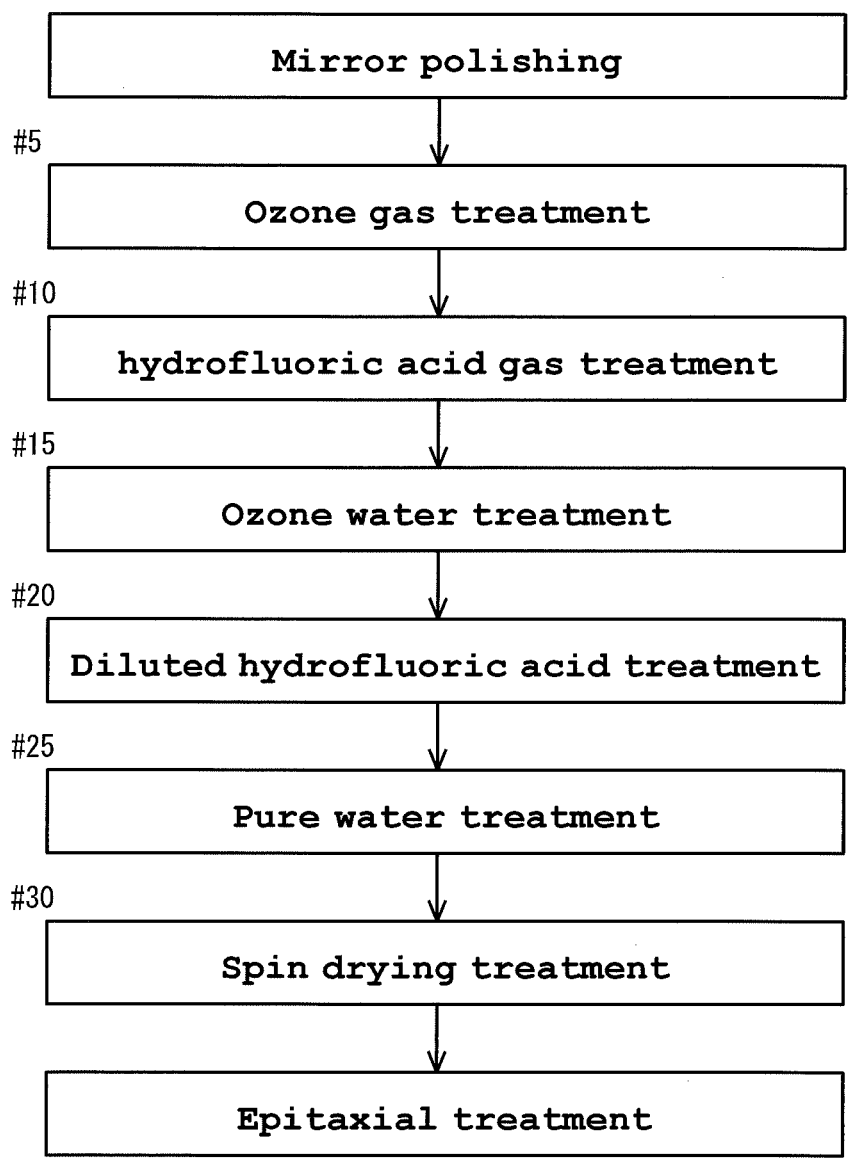
FIG. 3 is a flow chart showing one example of treatment steps in a silicon wafer cleaning method of the present invention.

FIG. 3 is a flow chart showing one example of treatment steps in a silicon wafer cleaning method of the present invention. In the cleaning method of the present invention, a silicon wafer is subjected to mirror polishing and then to an ozone gas treatment in step #5 to oxidize the surface of the silicon wafer by use of ozone ($O_3$) gas.

At this time, if PIDs as being transformed into amorphous oxide ($SiO_x$) are generated on the wafer surface by the mirror polishing of the previous step, the PIDs are forcedly oxidized by the ozone gas in a chemical form of $SiO_2$. This is because the ozone gas is far higher in $O_3$ concentration than the ozone water used in an ordinary cleaning process, and has remarkably high oxidizing power. For example, the $O_3$ concentration of the ozone gas is 105 g/m$^3$ or more, while the $O_3$ concentration of ozone water is generally about 15 ppm (15 g/m$^3$).

This ozone gas treatment can be efficiently performed by disposing the silicon wafer within a tightly sealed container and maintaining the inside of the container in an atmosphere of the ozone gas. In the ozone gas treatment, the ozone gas can be sprayed to the surface of the silicon wafer disposed inside the tightly sealed container.

In step #10, a hydrofluoric acid gas treatment is performed by use of hydrofluoric acid gas to dissolve and remove the oxidized surface of the silicon wafer after the ozone gas treatment.

At this time, the PIDs which have been transformed into $SiO_2$ by the ozone gas treatment are dissolved and removed by the hydrofluoric acid gas. This is because the hydrofluoric acid gas is far higher in HF concentration than the diluted hydrofluoric acid used in an ordinary cleaning process, and has a remarkably high etching rate. For example, the HF concentration of the stock solution of the hydrofluoric acid gas is 48 wt % or more, while the HF concentration of the diluted hydrofluoric acid is generally about 1 wt %. This stock solution is used and bubbled with nitrogen gas, whereby the hydrofluoric acid gas is generated.

The hydrofluoric acid gas treatment can be efficiently performed by disposing the silicon wafer in a tightly sealed container and maintaining the inside of the container in an atmosphere of the hydrofluoric acid gas. In the hydrofluoric acid gas treatment, the hydrofluoric acid gas may be sprayed onto the surface of the silicon wafer disposed inside the tightly sealed container.

Thereafter, washing is performed through the following steps #15 to #30 to remove foreign substances such as oxides, particles and metals that remain on the wafer surface.

Namely, similarly to the ordinary washing step, the ozone water treatment is performed in step #15 to oxidize the wafer surface by use of ozone water, and the diluted hydrofluoric acid treatment is successively performed in step #20 to remove the oxide film on the wafer surface by use of diluted hydrofluoric acid, whereby the wafer surface is washed. Further, in step #25, the wafer surface is rinsed by a pure water treatment using pure water, and finally subjected to a spin drying treatment in step #30.

Any of a group consisting of the ozone water treatment, diluted hydrofluoric acid treatment and pure water treatment can be performed by dipping the silicon wafer in relevant treatment solution or spraying relevant treatment solution to the wafer surface.

The ozone water treatment of step #15 and the diluted hydrofluoric acid treatment of step #20 can be alternately repeated, and the ozone water treatment of step #15 can be performed just before the pure water treatment of step #25.

As the ozone water to be used in the ozone water treatment, the one having an $O_3$ concentration of about 10 to 15 ppm (10 to 15 g/m$^3$) is adopted, and as the diluted hydrofluoric acid to be used in the diluted hydrofluoric acid treatment, the one having an HF concentration of about 0.5 to 1 wt % can be adopted. Instead of the ozone water treatment as step #15 and the diluted hydrofluoric acid treatment as step #20, the wafer surface can be cleaned by a treatment using a mixture of ozone water and diluted hydrofluoric acid.

Instead of the ozone water treatment of step #15 and the diluted hydrofluoric acid treatment of step #20, further, the water surface may be washed by a treatment using a so-called SC-1 detergent which is obtained by mixing ammonia water ($NH_4OH$) with hydrogen peroxide ($H_2O_2$). This SC-1 detergent is prepared by mixing them in the proportion of $NH_4OH$:$H_2O_2$:$H_2O$=1:1-5:5-50.

After these sequential treatments are completed, an epitaxial treatment is performed. In the epitaxial treatment, the silicon wafer after cleaned is disposed in a reacting furnace for a single wafer and heated at 1000° C. or higher while a carrier gas (e.g., hydrogen ($H_2$)) is introduced into the reacting furnace together with a Si-containing source gas (e.g., silicon tetrachloride ($SiCl_4$), trichlorosilane ($SiHCl_3$)). According to this, an epitaxial layer as being a single crystal silicon film can be vapor-deposited on the wafer surface.

Figure 4:
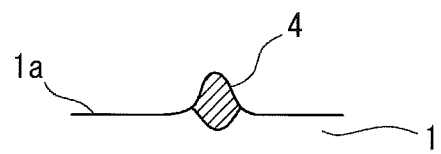
FIG. 4 are schematic views for illustrating the behavior of a PID when a silicon wafer cleaning method of the present invention is adopted, wherein FIG. 4(a), FIG. 4(b), and FIG. 4(c) respectively show the cases after mirror polishing, after cleaning and after epitaxial treatment.
Figure 4:
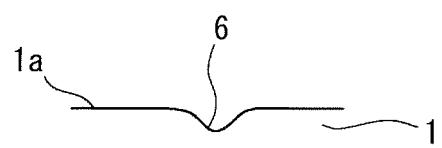
Figure 4:
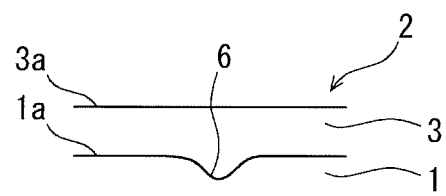

FIG. 4 are schematic views for illustrating the behavior of a PID when a silicon wafer cleaning method of the present invention is adopted, wherein FIG. 4(*a*), FIG. 4(*b*), and FIG. 4(*c*) respectively show the cases after mirror polishing, after cleaning and after epitaxial treatment.

When a PID 4 is generated on a surface 1*a* of a silicon wafer 1 in the mirror polishing step as shown in FIG. 4(*a*), and if the silicon wafer 1 is subjected to the above-mentioned ozone gas treatment and hydrofluoric acid gas treatment, the PID 4 is forcedly oxidized by the ozone gas treatment, and completely dissolved and removed by the hydrofluoric acid gas treatment as shown in FIG. 4(*b*). According to this, a concave portion 6 is formed on the surface 1*a* of the silicon wafer 1 at a location where the PID 4 once existed.

When the silicon wafer 1 is further subjected to the epitaxial treatment after the above-mentioned ozone water treatment, the diluted hydrofluoric acid treatment, the pure water treatment and the spin drying treatment, an epitaxial layer 3 is vapor-deposited on the whole area of the surface of the silicon wafer 1 including the location of the concave portion 6, as shown in FIG. 4(*c*). According to this, an epitaxial wafer 2 can sufficiently secure surface quality without generation of PID-induced convex defects on a surface 3*a* of the epitaxial layer 3. It should be noted that the silicon portion of wafer 1 is more easily oxidized by the ozone gas and more easily dissolved and removed by the hydrofluoric acid gas, compared with the case of the PID 4. As a result, the depth of the concave portion 6 becomes shallow since the removal of the surface 1*a* of the silicon portion of wafer 1 is progressed appreciably at a time when the PID 4 is removed. Therefore, the surface 3*a* of the epitaxial layer 3 can be made into a flat surface without generation of a pit at a location corresponding to that of the concave portion 6.

In the silicon wafer cleaning method of the present invention, time required for the ozone gas treatment is not particularly specified, but is set preferably to 60 seconds or more, more preferably to 150 seconds or more, since an excessively short-time treatment results in insufficient forced oxidation of PIDs.

Time required for the hydrofluoric acid gas treatment is not particularly specified, but is set preferably to 120 seconds or more, since an excessively short-time treatment results in insufficiently turning PIDs into concaves because insufficient dissolution of the forcedly oxidized PIDs occurs. On the other hand, since an excessively long-time treatment leads to haze (surface roughening) on the wafer surface, the time is preferably set to 300 seconds or less.

The silicon wafer cleaning method of the present invention is suitable for the production of an epitaxial wafer having an epitaxial layer as thin as 0.5 to 10 μm. This is because even if PIDs exist on the wafer surface, PID-induced convex defects are gradually flattened in accordance with the growth of the epitaxial layer, that is, the PID-induced convex defects are more likely to come up in appearance in case of a thin epitaxial layer rather than a thick epitaxial layer.

EXAMPLES

The following tests were performed to confirm the effect of a silicon wafer cleaning method and a method for producing an epitaxial wafer of the present invention.

As an inventive example, five wafers for testing, each being 300 mm in diameter, that were subjected to mirror polishing were prepared. Each wafer for testing was cleaned by performing each step shown in the above-mentioned FIG. 3, and then subjected to an epitaxial treatment. In the cleaning, 60-second ozone gas treatment and 120-second hydrofluoric acid gas treatment were performed, then 10-second ozone water treatment and 3-second diluted hydrofluoric acid treatment were repeated twice, followed by a 10-second ozone water treatment for the second time, and a 10-second pure water treatment and a 25-second spin drying treatment were thereafter performed. In the epitaxial treatment, $SiHCl_3$ was used as the source gas, and an epitaxial layer 5 μm in thickness was vapor-deposited at a reacting furnace temperature of 1130° C.

On each stage after the mirror polishing treatment, after the cleaning treatment and after the epitaxial treatment, the surface of each wafer for testing was observed using the above-mentioned MAGICS, and the number of convex defects on the surface of each wafer for testing was examined using the above-mentioned Surfscan SP2.

As a comparative example, five wafers for testing, each being 300 mm in diameter, that were subjected to mirror polishing were prepared, and each wafer for testing was subjected to an epitaxial treatment after it was cleaned. In the washing of the comparative example, the ozone gas treatment and hydrofluoric acid gas treatment in the washing treatment of the inventive example were omitted. Similarly to the inventive example, the surface observation of each wafer for testing and the examination of the number of convex defects on each wafer surface were carried out.

Figure 5:
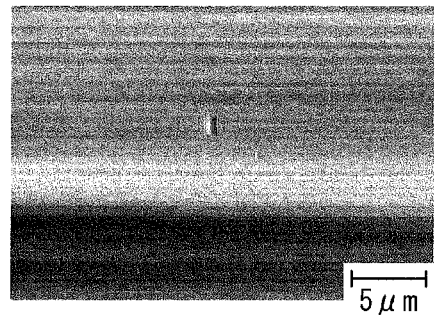
FIG. 5 are observation pictures of wafer surfaces after relevant treatments in an inventive example, wherein FIG. 5(a), FIG. 5(b), and FIG. 5(c) respectively show pictures after mirror polishing, after cleaning treatment, and after epitaxial treatment.
Figure 5:
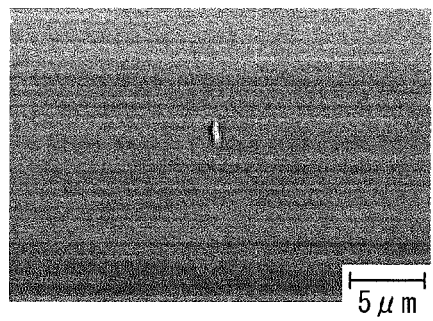
Figure 5:
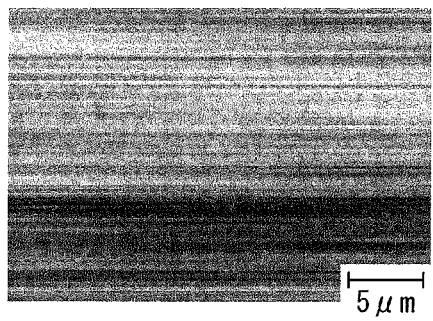

FIG. 5 are observation pictures of wafer surfaces after relevant treatments in an inventive example, wherein FIG. 5(a), FIG. 5(b), and FIG. 5(c) respectively show pictures after mirror polishing, after cleaning treatment, and after epitaxial treatment. FIGS. 5(a)-(c) show the pictures after relevant treatments for the same wafer, which are observed within the same field of view.

It could be confirmed that PIDs generated by mirror polishing (refer to FIG. 5(a)) are removed by cleaning including the ozone gas treatment and the hydrofluoric acid gas treatment, and concave portions are formed at the corresponding locations (refer to FIG. 5(b)). Accordingly, as shown in FIG. 5(c), it was revealed that PID-induced convex defects are never generated on the surface of the epitaxial layer.

Figure 6:
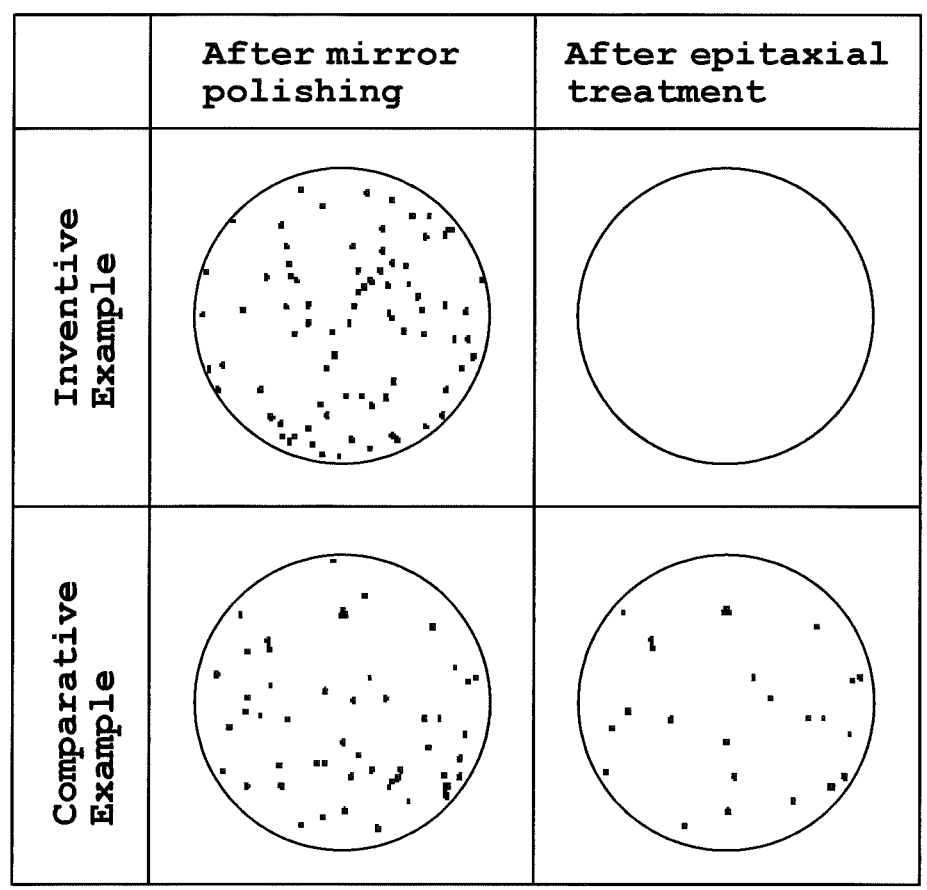
FIG. 6 is a view showing distributions of convex defects on wafer surfaces after mirror polishing and after epitaxial treatment, comparing the cases of an inventive example with those of a comparative example.

FIG. 6 is a view showing distributions of convex defects on wafer surfaces after mirror polishing and after epitaxial treatment, comparing the cases of an inventive example with those of a comparative example. As indicated by black dots in the same figure, PIDs were generated as convex defects over the whole area of the wafer surface after mirror polishing for both the inventive example and comparative example.

However, no convex defect was observed on the wafer surface after an epitaxial treatment of the inventive example. On the other hand, convex defects were observed on the wafer surface after the epitaxial treatment of the comparative example at locations corresponding to the generation locations of PIDs after mirror polishing, and about 30% of the PIDs after mirror polishing resulted in inducing convex defects.

INDUSTRIAL APPLICABILITY

According to a silicon wafer cleaning method of the present invention, prior to an epitaxial treatment, PIDs can be forcedly oxidized by an ozone gas treatment and dissolved and removed by a hydrofluoric acid gas treatment, and foreign substances remaining on the wafer surface can be also removed by a washing treatment. Therefore, by performing the epitaxial treatment thereafter, PID-induced convex defects are prevented from generating on the surface of an epitaxial layer, and an epitaxial wafer excellent in surface quality can be thus produced.

| REFERENCE SIGNS LIST | |
|---|---|
| 1: | Silicon wafer |
| 1a: | Surface of silicon wafer |
| 2: | Epitaxial wafer |
| 3: | Epitaxial layer |
| 3a: | Surface of epitaxial layer |
| 4: | PID |
| 5. | PID-induced convex defect |
| 6. | Concave portion |

What is claimed is:

1. A method for cleaning a surface of a silicon wafer after being subjected to mirror polishing but before being subjected to form an epitaxial layer thereon, comprising:
    an ozone gas treatment step that oxidizes convex defects that have been transformed into amorphous oxide on the surface of the silicon wafer by use of ozone gas; and
    a hydrofluoric acid gas treatment step that dissolves and removes convex defects on the oxidized surface of the silicon wafer by use of hydrofluoric acid gas,
    wherein the $O_3$ concentration of the ozone gas in the ozone gas treatment is 105 g/m$^3$ or more, while the hydrofluoric acid gas is generated by causing a stock solution of the hydrofluoric acid gas to be bubbled with nitrogen gas, the stock solution having a HF concentration of 48 wt % or more,
    the silicon wafer is subjected, after the hydrofluoric acid gas treatment step, to a washing step by performing an ozone treatment and a diluted hydrofluoric acid treatment to removes foreign substances remaining on the surface of the silicon wafer, and
    the silicon wafer is held inside a tightly sealed container and in an atmosphere of ozone gas for 60 seconds or more in the ozone gas treatment step, and the silicon wafer is held inside the tightly sealed container and in an atmosphere of hydrofluoric acid gas for 120 seconds or more in the hydrofluoric acid gas treatment step.

2. The method for cleaning a surface of a silicon wafer according to claim 1, in the ozone gas treatment, the ozone gas is sprayed to the surface of the silicon wafer disposed inside the tightly sealed container, and in the hydrofluoric acid gas treatment, the hydrofluoric acid gas is sprayed onto the surface of the silicon wafer disposed inside the tightly sealed container.

3. A method for producing an epitaxial wafer, comprising: vapor-depositing an epitaxial layer on a surface of a silicon wafer which has been cleaned by the method for cleaning a surface of a silicon wafer according to claim 1.

4. A method for producing an epitaxial wafer, comprising: vapor-depositing an epitaxial layer on a surface of a silicon wafer which has been cleaned by the method for cleaning a surface of a silicon wafer according to claim 2.

* * * * *